(12) United States Patent
Yamahira

(10) Patent No.: US 10,305,466 B2
(45) Date of Patent: May 28, 2019

(54) POWER CONVERSION APPARATUS

(71) Applicant: DENSO CORPORATION, Kariya, Aichi-pref. (JP)

(72) Inventor: Yuu Yamahira, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/438,126

(22) Filed: Feb. 21, 2017

(65) Prior Publication Data

US 2017/0244390 A1    Aug. 24, 2017

(30) Foreign Application Priority Data

Feb. 19, 2016  (JP) ................................. 2016-030162

(51) Int. Cl.
| | |
|---|---|
| *H03K 17/14* | (2006.01) |
| *H02P 29/68* | (2016.01) |
| *B60L 11/14* | (2006.01) |
| *H02M 1/08* | (2006.01) |
| *H03K 3/011* | (2006.01) |
| *H03K 17/04* | (2006.01) |
| *H03K 17/041* | (2006.01) |
| *H03K 17/0412* | (2006.01) |
| *H05K 7/20* | (2006.01) |
| *H01L 29/00* | (2006.01) |

(Continued)

(52) U.S. Cl.
CPC .............. *H03K 17/14* (2013.01); *B60L 11/14* (2013.01); *H01L 29/00* (2013.01); *H02M 1/08* (2013.01); *H02P 27/085* (2013.01); *H02P 29/68* (2016.02); *H03K 3/011* (2013.01); *H03K 17/04* (2013.01); *H03K 17/041* (2013.01); *H03K 17/0412* (2013.01); *H03K 17/163* (2013.01); *H05K 7/2089* (2013.01); *H02M 7/003* (2013.01); *H02M 2001/0003* (2013.01); *H02P 27/06* (2013.01); *H03K 2005/00032* (2013.01); *H03K 2017/0806* (2013.01)

(58) Field of Classification Search
CPC ......... H03K 3/011; H03K 2005/00032; H03K 17/14; H03K 17/15; H03K 17/04; H03K 17/041; H03K 17/0412
See application file for complete search history.

(56) References Cited

U.S. PATENT DOCUMENTS

| | | | |
|---|---|---|---|
| 6,373,296 B1 * | 4/2002 | Auer .................... | H03K 17/163 327/108 |
| 7,839,200 B2 * | 11/2010 | Im ............................ | G11C 7/04 327/170 |

(Continued)

FOREIGN PATENT DOCUMENTS

| | | |
|---|---|---|
| JP | 2002125363 A | 4/2002 |
| JP | 2007089325 A | 4/2007 |
| JP | 2008178200 A | 7/2008 |

*Primary Examiner* — Thomas J. Hiltunen
(74) *Attorney, Agent, or Firm* — Oliff PLC

(57) ABSTRACT

A semiconductor module including a semiconductor element, a controller, a cooler, and a temperature sensor are included. The controller is connected to the semiconductor module and controls switching operation of the semiconductor element. The temperature sensor measures a coolant temperature, which is a temperature of the coolant. The controller controls turn-off speed of the semiconductor element based on the coolant temperature. The controller increases the turn-off speed as the coolant temperature rises.

3 Claims, 14 Drawing Sheets

(51) Int. Cl.
    *H03K 17/16*     (2006.01)
    *H02P 27/08*     (2006.01)
    *H02M 1/00*     (2006.01)
    *H02P 27/06*     (2006.01)
    *H03K 5/00*     (2006.01)
    *H02M 7/00*     (2006.01)
    *H03K 17/08*     (2006.01)

(56) References Cited

U.S. PATENT DOCUMENTS

| | | | |
|---|---|---|---|
| 8,717,069 B2* | 5/2014 | Curbelo | H03K 17/163 |
| | | | 327/108 |
| 2007/0041224 A1* | 2/2007 | Moyse | H02M 3/157 |
| | | | 363/21.01 |
| 2010/0050676 A1* | 3/2010 | Takamatsu | B60K 11/02 |
| | | | 62/259.2 |
| 2010/0148846 A1* | 6/2010 | Hiyama | H03K 17/168 |
| | | | 327/376 |
| 2013/0215571 A1 | 8/2013 | Miyamoto et al. | |
| 2015/0171859 A1* | 6/2015 | Pisau | H03K 17/302 |
| | | | 327/379 |
| 2016/0211767 A1* | 7/2016 | Hotta | H02M 1/08 |
| 2016/0252402 A1* | 9/2016 | Singh | G01K 7/42 |
| | | | 702/130 |
| 2016/0329733 A1* | 11/2016 | Daigo | H02M 1/34 |
| 2016/0373047 A1* | 12/2016 | Loken | H02P 29/0088 |
| 2017/0033722 A1* | 2/2017 | Ochs | H02M 7/537 |
| 2017/0373676 A1* | 12/2017 | Kaeriyama | H03K 17/0406 |
| 2018/0167013 A1* | 6/2018 | Xu | H03K 17/14 |

* cited by examiner

POWER CONVERSION APPARATUS

CROSS-REFERENCE TO RELATED APPLICATION

This application is based on and claims the benefit of priority from earlier Japanese Patent Application No. 2016-030162 filed Feb. 19, 2016, the description of which is incorporated herein by reference.

BACKGROUND

Technical Field

The present invention relates to a power conversion apparatus that includes a semiconductor module including semiconductor elements, a cooler cooling the semiconductor module, and a controller controlling switching operations of the semiconductor elements.

Related Art

As a power conversion apparatus converting between DC power and AC power, an apparatus is known that includes a semiconductor module, which includes semiconductor elements such as IGBTs, and a controller connected to the semiconductor module (refer to JP-A-2008-178200). The power conversion apparatus uses the controller to make the semiconductor elements perform switching operations, thereby converting DC power to AC power.

Since the power conversion causes heat generation from the semiconductor elements, the power conversion apparatus cools the semiconductor elements by using a cooler. In the cooler, a flow path is formed through which a coolant flows. Heat exchange between the coolant and the semiconductor elements cools the semiconductor elements.

In addition, the power conversion apparatus of JP-A-2008-178200 is provided with a temperature sensor in the semiconductor module to measure a temperature (hereinafter, also referred to as an element temperature) of the semiconductor element. The controller controls turn-off speed of the semiconductor element based on the measured value of the element temperature. That is, for example, if the element temperature becomes a predetermined threshold value or more, the controller increases the turn-off speed. If the element temperature becomes less than the predetermined threshold value, the controller decreases the turn-off speed. Thereby, the element temperature is prevented from excessively rising, and the semiconductor element is protected from a turn-off surge.

That is, increasing the turn-off speed decreases the amount of heat generation (loss), and decreasing the turn-off speed increases the amount of heat generation. Hence, since increasing the turn-off speed when the element temperature has become high can decrease the amount of heat generation, the element temperature can be prevented from excessively rising. Accordingly, the element temperature can be prevented from exceeding a predetermined upper limit value.

In addition, as described later, increasing the turn-off speed when the element temperature is high and decreasing the turn-off speed when the element temperature is low can also protect the semiconductor element from a turn-off surge.

However, the power conversion apparatus is difficult to reduce the manufacturing cost thereof while preventing the element temperature from exceeding the upper limit value. That is, when the power conversion apparatus is operating, the temperature of the coolant (hereinafter, also referred to as a coolant temperature) may be relatively high, and the element temperature may be lower than the threshold value. In this case, since the element temperature has not exceeded the threshold value, the controller decreases the turn-off speed. Hence, the amount of heat generation of the semiconductor element becomes high. Accordingly, although the coolant temperature is high, and it is difficult to cool the semiconductor element, the amount of heat generation becomes large. Thereby, the element temperature may sharply rise to exceed the upper limit value.

Even in the above case, to prevent the element temperature from greatly exceeding the upper limit value, it is required to enlarge the area of the semiconductor element to decrease the amount of heat generation per unit area so as to restrain the amount of temperature rise of the semiconductor element. Accordingly, the manufacturing cost of the semiconductor element easily increases.

SUMMARY

An embodiment provides a power conversion apparatus that can prevent an element temperature from exceeding an upper limit value, that is highly resistant to turn-off surge, and that can reduce the manufacturing cost thereof.

As an aspect of the embodiment, a power conversion apparatus is provided that includes:

a semiconductor module that includes a semiconductor element;

a controller that is connected to the semiconductor module and controls switching operation of the semiconductor element;

a cooler that has a flow path, through which a coolant flows, and cools the semiconductor element; and a temperature sensor that measures a coolant temperature, which is a temperature of the coolant.

The controller controls turn-off speed of the semiconductor element based on a measurement value of the coolant temperature so that the turn-off speed increases as the coolant temperature rises.

The controller of the power conversion apparatus controls turn-off speed based on a measurement value of the coolant temperature so that the turn-off speed increases as the coolant temperature rises.

Hence, an element temperature can be prevented from exceeding an upper limit value, and the manufacturing cost of the power conversion apparatus can be reduced. That is, when the coolant temperature is high, the controller increases the turn-off speed. Hence, when the coolant temperature is high, and it is difficult to cool the semiconductor element, the amount of heat generation of the semiconductor element can be reduced. Accordingly, the element temperature is easily prevented from exceeding the upper limit value. Hence, even if the area of the semiconductor element is decreased to increase the amount of heat generation per unit area, it becomes difficult for the element temperature to exceed the upper limit value. Accordingly, the semiconductor element can be reduced in size, whereby the manufacturing cost thereof can be reduced.

In addition, when the coolant temperature is high, withstand voltage of the semiconductor element becomes high. When the coolant temperature is low, the withstand voltage becomes low. Hence, even if a high turn-off surge is generated by increasing the turn-off speed when the coolant temperature is high, the semiconductor element can be sufficiently protected from the turn-off surge because the withstand voltage of the semiconductor element is high. In addition, since the controller decreases the turn-off speed when the coolant temperature is low, the turn-off surge can be reduced. Hence, when the coolant temperature is low, and the withstand voltage is low, the turn-off surge can be reduced, whereby the semiconductor element can be protected from the turn-off surge.

As described above, according to the embodiment, a power conversion apparatus can be provided that can prevent an element temperature from exceeding an upper limit value, that is highly resistant to turn-off surge, and that can reduce the manufacturing cost thereof.

Note that reference numerals in parentheses written in the claims and SUMMARY indicate correspondence relationships with specific means written in embodiments described later and do not limit the technical scope of the present invention.

DETAILED DESCRIPTION OF THE PREFERRED EMBODIMENTS

The power conversion apparatus may be an in-vehicle power conversion apparatus installed in a vehicle such as an electric vehicle or a hybrid vehicle.

First Embodiment

Figure 10:
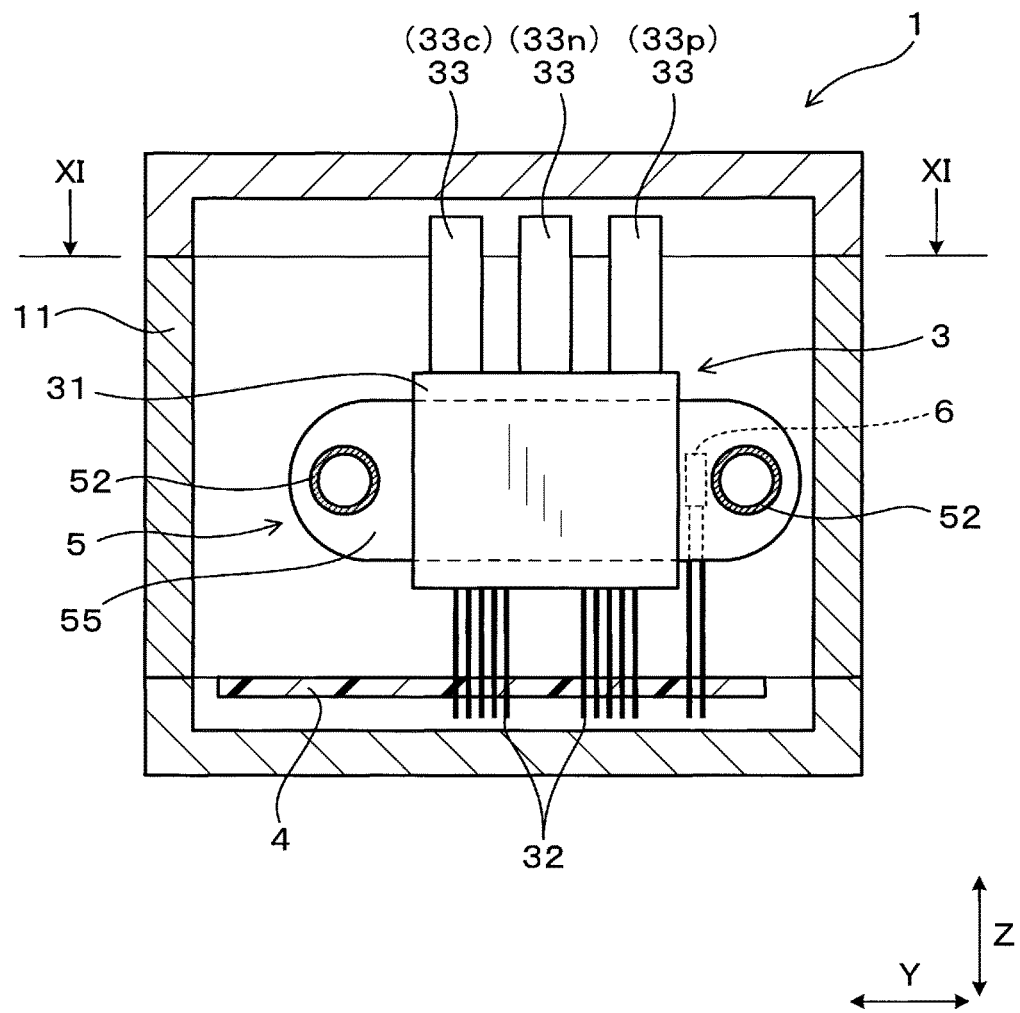
FIG. 10 is a sectional view of a power conversion apparatus, which is a sectional view cut along the line X-X of FIG. 11, according to the first embodiment.
Figure 11:
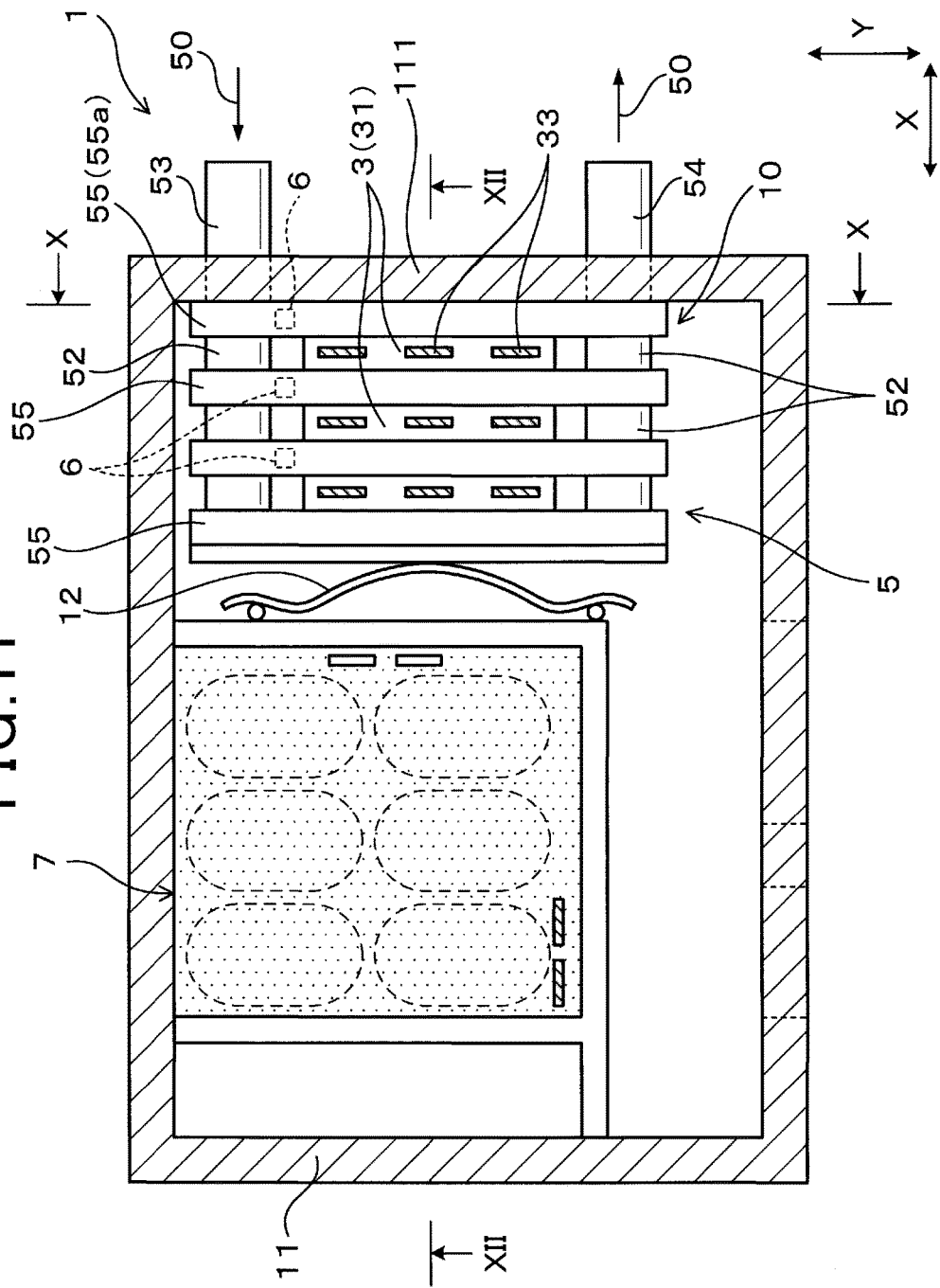
FIG. 11 is a sectional view cut along the line XI-XI of FIG. 10.
Figure 12:
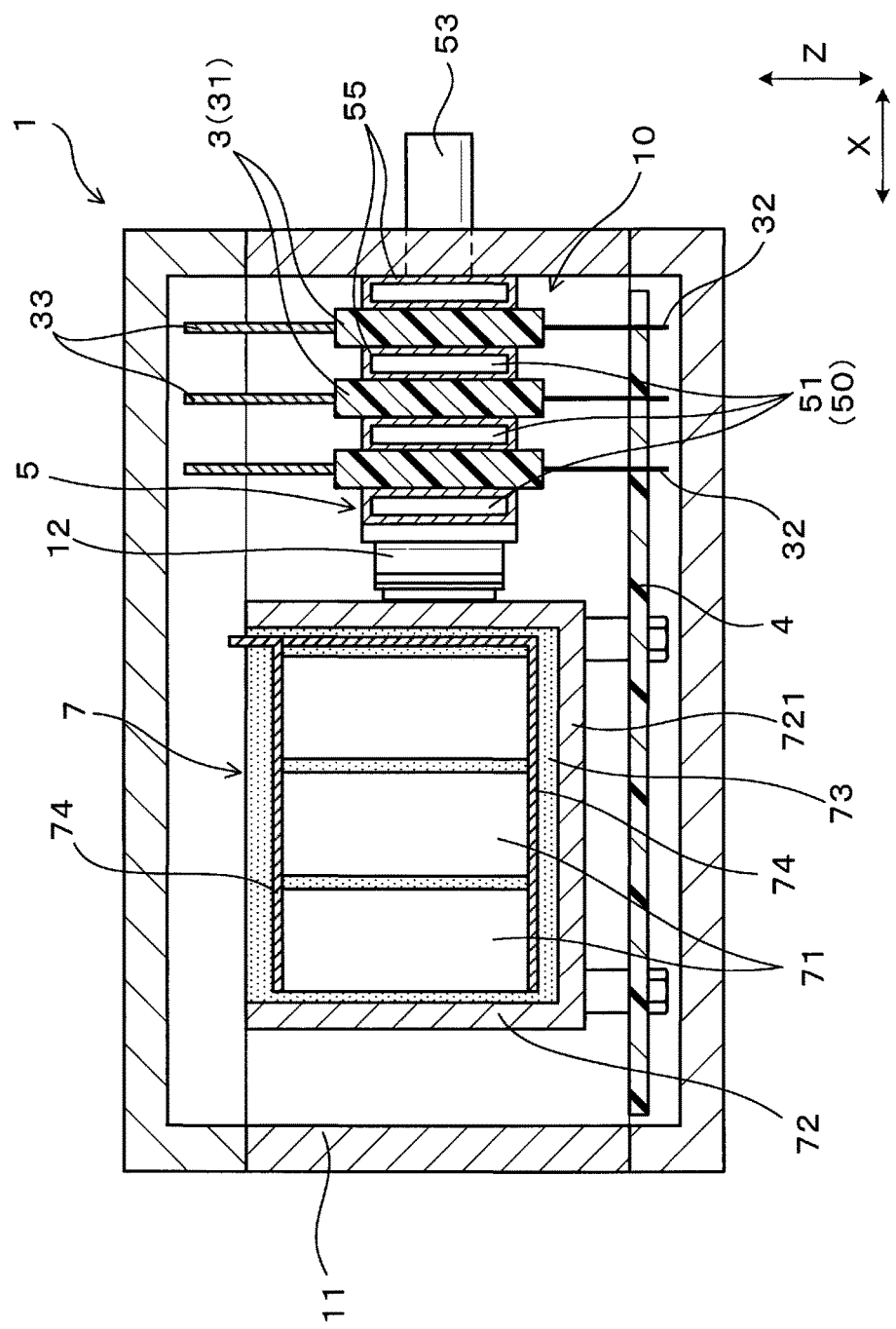
FIG. 12 is a sectional view cut along the line XII-XII of FIG. 11.

An embodiment of the power conversion apparatus will be described with reference to FIG. 1 to FIG. 16. As shown in FIG. 10 to FIG. 12, a power conversion apparatus 1 of the present embodiment includes semiconductor modules 3 including semiconductor elements 2, a controller 4, a cooler 5, and temperature sensors 6.

The controller 4 is connected to the semiconductor modules 3 and controls switching operations of the semiconductor elements 2. In the cooler 5, flow paths 51 are formed through which a coolant 50 flows. The cooler 5 cools the semiconductor elements 2. The temperature sensors 6 are disposed in the flow paths 51 of the cooler 5. The temperature sensors 6 measure a coolant temperature $T_r$, which is a temperature of the coolant 50. The temperature sensors 6 are connected to the controller 4.

Figure 2:
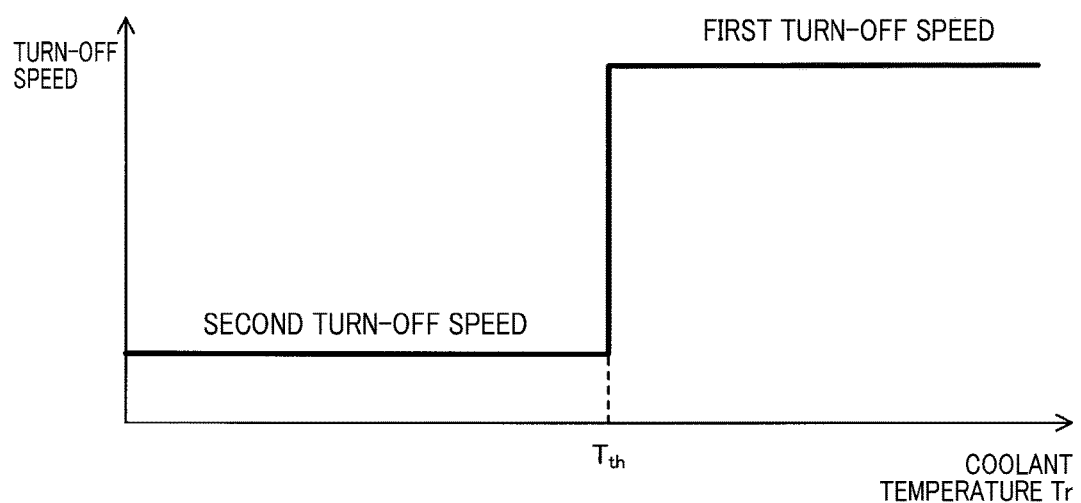
FIG. 2 is a graph showing a relationship between turn-off speed of a semiconductor element and coolant temperature according to the first embodiment.

The controller 4 controls turn-off speed (off speed) of the semiconductor elements 2 based on the measurement value of the coolant temperature $T_r$. As shown in FIG. 2, the controller 4 increases the turn-off speed as the coolant temperature $T_r$ rises.

Figure 13:
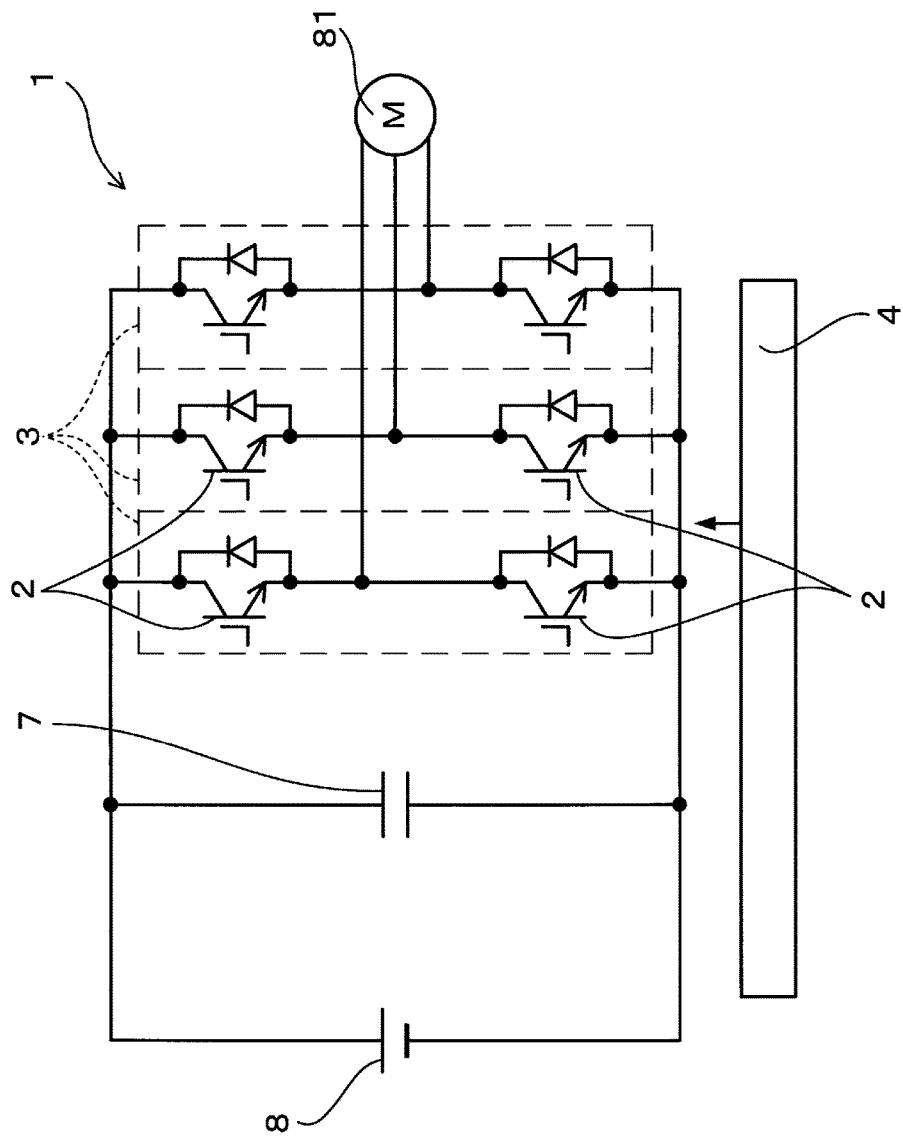
FIG. 13 is a circuit diagram of the power conversion apparatus according to the first embodiment.

The power conversion apparatus 1 of the present embodiment is an in-vehicle power conversion apparatus installed in a vehicle such as an electric vehicle or a hybrid vehicle. As shown in FIG. 13, the power conversion apparatus 1 of the present embodiment includes a plurality of semiconductor modules 3. As described above, the semiconductor modules 3 include the semiconductor elements 2. The semiconductor elements 2 are insulated gate bipolar transistors (IGBT).

As described above, the controller 4 controls switching operations of the semiconductor elements 2. Thereby, DC power supplied from a DC power supply 8 is converted to AC power. Then, a motor 81 is driven by using the obtained AC power to make the vehicle travel. In addition, the power conversion apparatus 1 includes a capacitor 7. The capacitor 7 smooths the DC voltage applied to the semiconductor modules 3.

Figure 1:
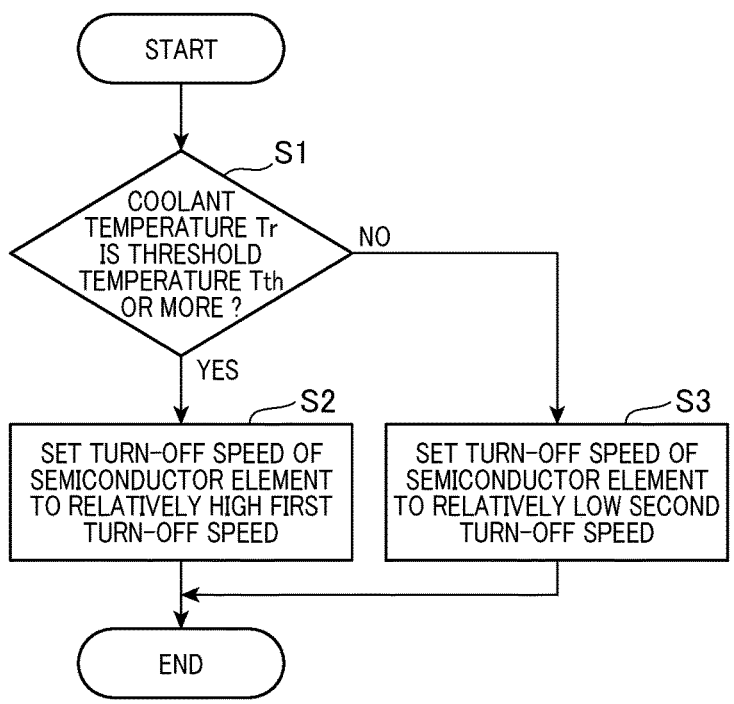
FIG. 1 is a flowchart of a process executed by a controller according to a first embodiment.

Next, the flowchart of a process executed by the controller 4 will be described. As shown in FIG. 1, in step S1, the controller 4 determines whether or not the coolant temperature $T_r$ is a predetermined threshold temperature $T_{th}$ or more. If a determination of Yes is made in step S1, the process proceeds to step S2. Then, the controller 4 sets the turn-off speed of the semiconductor elements 2 to a relatively high first turn-off speed. In contrast, if a determination of No is made in step S1, the process proceeds to step S3, in which the controller 4 sets the turn-off speed of the semiconductor elements 2 to a second turn-off speed lower than the first turn-off speed.

Figure 3:
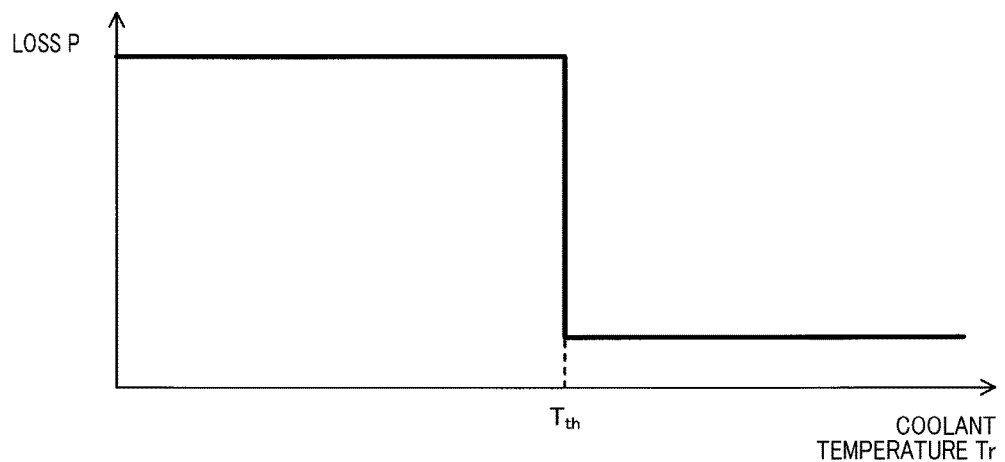
FIG. 3 is a graph showing a relationship between a loss of the semiconductor element and coolant temperature according to the first embodiment.

Hence, as shown in FIG. 2, if the coolant temperature $T_r$ is the threshold temperature $T_{th}$ or more, the turn-off speed becomes the relatively high first turn-off speed. If the coolant temperature $T_r$ is less than the threshold temperature $T_{th}$, the turn-off speed becomes the relatively low second turn-off speed. In addition, increasing the turn-off speed reduces the loss (the amount of heat generation) of the semiconductor elements 2, and decreasing the turn-off speed increases the loss of the semiconductor elements 2. Accordingly, as shown in FIG. 3, when the coolant temperature $T_r$ is the threshold temperature $T_{th}$ or more, the loss decreases. When the coolant temperature $T_r$ is less than the threshold temperature $T_{th}$, the loss increases.

Figure 7:
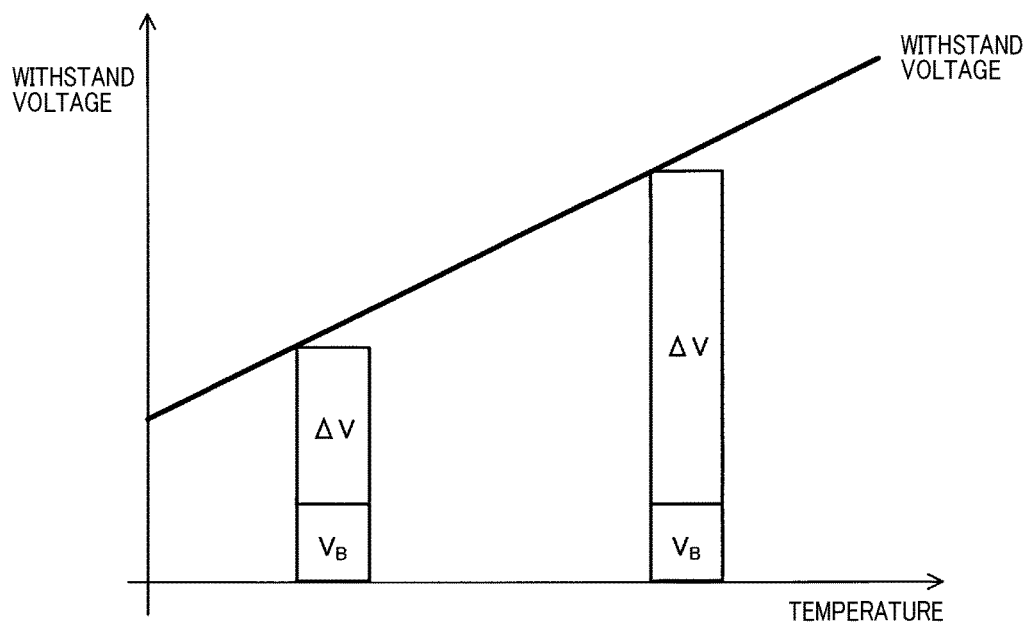
FIG. 7 is a graph showing a relationship between withstand voltage and element temperature of the semiconductor element according to the first embodiment.

As shown in FIG. 7, the semiconductor elements 2 have such properties that withstand voltage thereof becomes lower as the temperature thereof becomes lower, and that the withstand voltage thereof becomes higher as the temperature thereof becomes higher. In addition, when the power conversion apparatus 1 is operated, the sum of a power-supply voltage $V_B$ and a turn-off surge (off surge) $\Delta V$, $V_B+\Delta V$, is applied to the semiconductor elements 2. Hence, when the temperature is lower, the turn-off surge $\Delta V$ is required to be lower so that $V_B+\Delta V$ becomes the withstand voltage or less.

Figure 8:
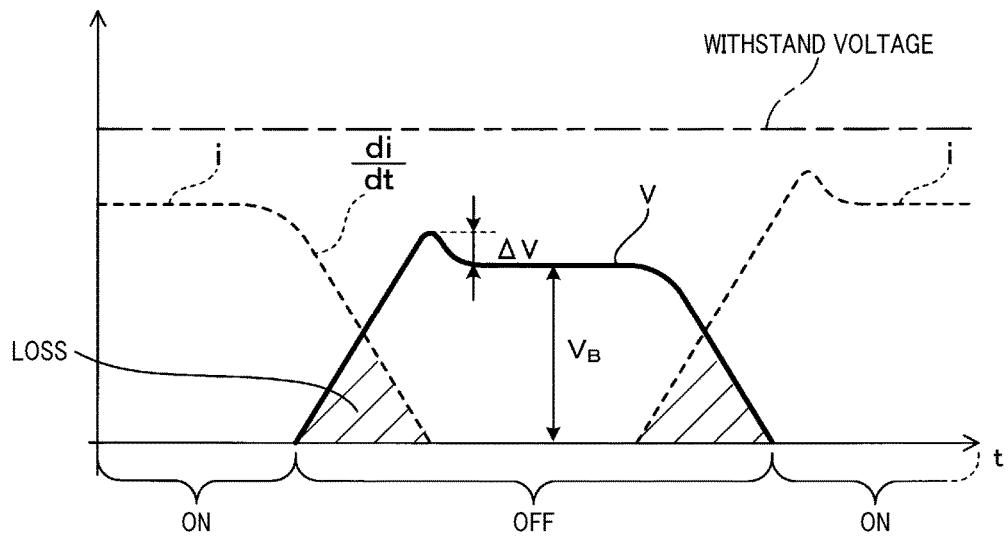
FIG. 8 is a graph showing turn-on speed and turn-off speed in a case where coolant temperature is lower than a threshold temperature according to the first embodiment.

FIG. 8 is a graph showing a relationship between switching speed di/dt, turn-off surge $\Delta V$, and withstand voltage of the semiconductor element 2 in a case where the coolant temperature $T_r$ is lower than the threshold temperature $T_{th}$. In the present embodiment, as described above, when the coolant temperature $T_r$ is low and the withstand voltage is low, the turn-off speed di/dt is decreased. Hence, the turn-off surge $\Delta V$ can be small. Hence, the sum $V_B+\Delta V$ of the power-supply voltage $V_B$ and the turn-off surge $\Delta V$ can be the withstand voltage or less, whereby the semiconductor element 2 can be protected from a turn-off surge. In addition, when the turn-off speed is decreased, the loss becomes large. However, since the coolant temperature $T_r$ is low, which easily cools the semiconductor element 2, the loss can be allowed to be large.

Figure 9:
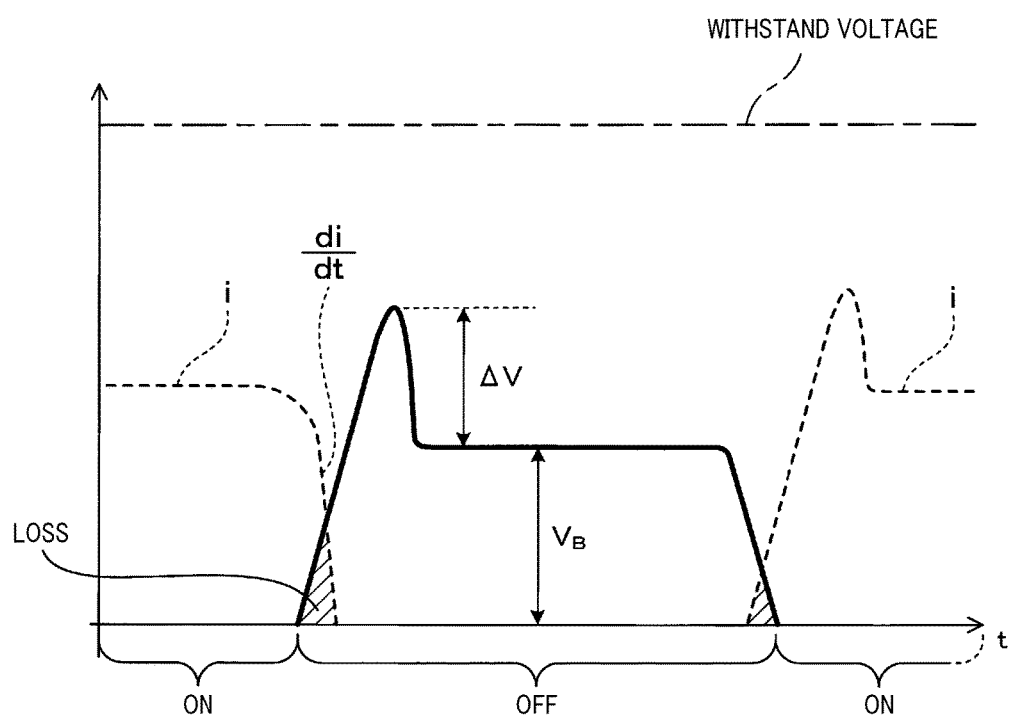
FIG. 9 is a graph showing turn-on speed and turn-off speed in a case where coolant temperature is higher than the threshold temperature according to the first embodiment.

Next, FIG. 9 is a graph showing a relationship between switching speed di/dt, turn-off surge $\Delta V$, and withstand voltage of the semiconductor element 2 in a case where the coolant temperature $T_r$ is higher than the threshold temperature $T_{th}$. In the present embodiment, as described above, when the coolant temperature $T_r$ is high and the withstand voltage is high, the turn-off speed di/dt is increased. Hence, the turn-off surge $\Delta V$ becomes large. Since the withstand voltage of the semiconductor element 2 is high, even when the turn-off surge $\Delta V$ becomes large, $V_B+\Delta V$ can be the withstand voltage or less. In addition, when the coolant temperature $T_r$ is high, the semiconductor element 2 is difficult to be cooled. However, since increasing the turn-off speed di/dt can reduce the loss, an element temperature $T_s$ can be prevented from excessively rising.

Figure 4:
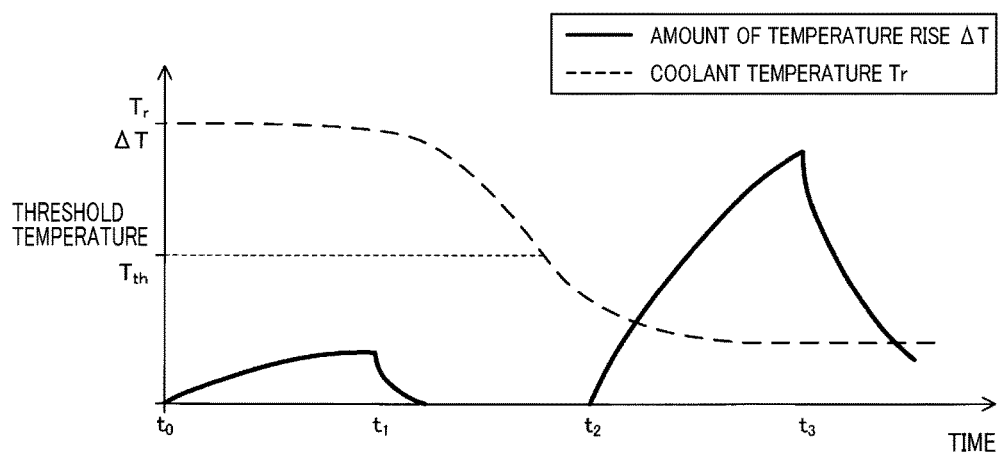
FIG. 4 is a graph showing variations with time of the amount of temperature rise of the semiconductor element and coolant temperature according to the first embodiment.
Figure 5:
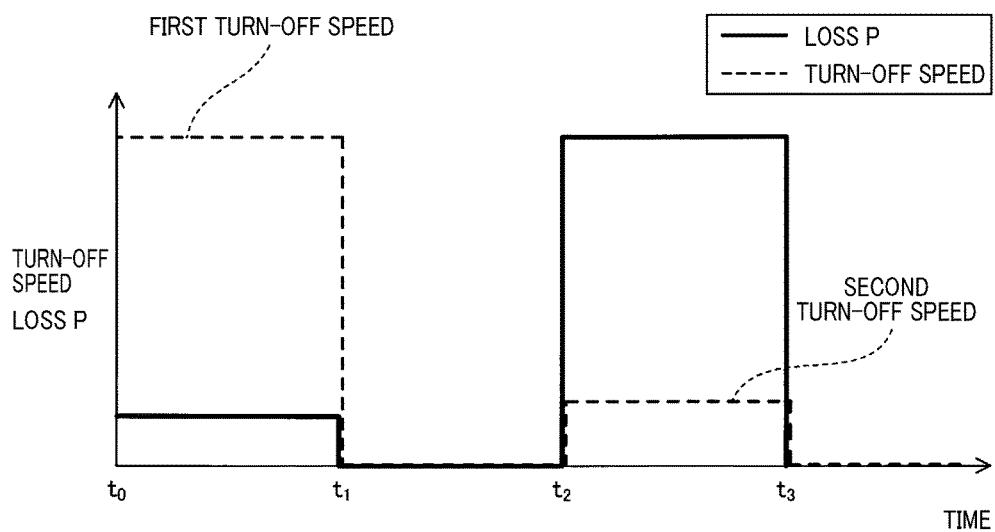
FIG. 5 is a graph showing variations with time of turn-off speed and a loss of the semiconductor element according to the first embodiment.
Figure 6:
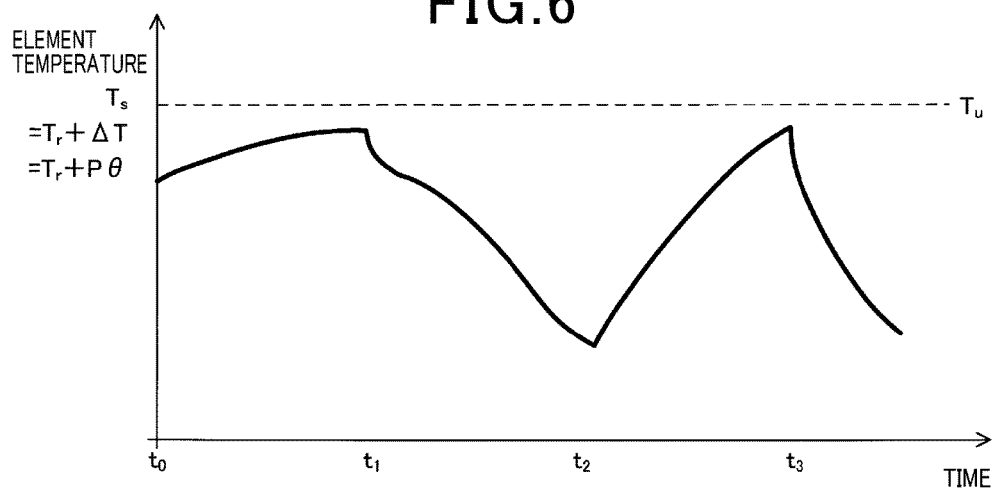
FIG. 6 is a graph showing a variation with time of element temperature according to the first embodiment.

Next, with reference to FIG. 4 to FIG. 6, variations with time of coolant temperature $T_r$, the amount $\Delta T$ of temperature rise with respect to the coolant temperature $T_r$ of the semiconductor element 2, turn-off speed, a loss P, and element temperature $T_s$ will be described. All the horizontal axes in FIG. 4 to FIG. 6 are the same. That is, FIG. 4 to FIG. 6 are graphs of values of the coolant temperature $T_r$, the amount $\Delta T$ of temperature rise, and the like at the same time.

The temperature of the semiconductor element 2 (element temperature $T_s$) is a value obtained by adding the amount $\Delta T$ of temperature rise to the coolant temperature $T_r$. That is, $$T_s = T_r + \Delta T \qquad (1).$$

In addition, the amount $\Delta T$ of temperature rise is a value obtained by multiplying the loss P by thermal resistance $\theta$ of the semiconductor element 2. That is, $\Delta T = P\theta$. Hence, the expression (1) can be rewritten to $$T_s = T_r + P\theta \qquad (2).$$

In the graphs shown in FIG. 4 to FIG. 6, between times $t_0$ and $t_1$, the power conversion apparatus 1 is operated. In addition, between times $t_1$ and $t_2$, the power conversion apparatus 1 is stopped. Then, between times $t_2$ and $t_3$, the power conversion apparatus 1 is operated again.

For example, a stopped vehicle may be started by the motor 81 (refer to FIG. 13). In this case, the vehicle is accelerated for a few seconds by using the motor 81. Then, the vehicle is driven by an engine. Hence, the time period during which the power conversion apparatus 1 is used, that is, the time period ($t_0$ to $t_1$, $t_2$ to $t_3$) during which the semiconductor elements 2 generate heat is a few seconds.

As shown in FIG. 4, when the power conversion apparatus 1 is started at time $t_0$, the semiconductor element 2 generates heat (loss P), whereby $\Delta T$ rises. Since the semiconductor element 2 has heat capacity, $\Delta T$ does not sharply rise but gradually increases. In addition, at time $t_0$, since the coolant temperature $T_r$ is higher than the threshold temperature $T_{th}$, the controller 4 sets the turn-off speed of the semiconductor element 2 to a relatively high first turn-off speed. As shown in FIG. 5, since the loss P is relatively small at the first turn-off speed, the amount $\Delta T$ of temperature rise is relatively small. Hence, as shown in FIG. 6, the element temperature $T_s$ is limited to a value slightly higher than the coolant temperature $T_r$. Accordingly, the element temperature $T_s$ can be prevented from exceeding an upper limit value $T_u$.

At time $t_1$, when the operation of the power conversion apparatus 1 is stopped, the coolant temperature $T_r$ gradually falls. Then, at time $t_2$, the power conversion apparatus 1 starts again. At time $t_2$, since the coolant temperature $T_r$ is lower than the threshold temperature $T_{th}$, the controller 4 sets the turn-off speed of the semiconductor element 2 to a relatively low second turn-off speed. Since the loss P is relatively large at the second turn-off speed, the amount $\Delta T$ of temperature rise becomes large. However, since the coolant temperature $T_r$ is low, the element temperature $T_s$ can be prevented from exceeding the upper limit value $T_u$.

Figure 22:
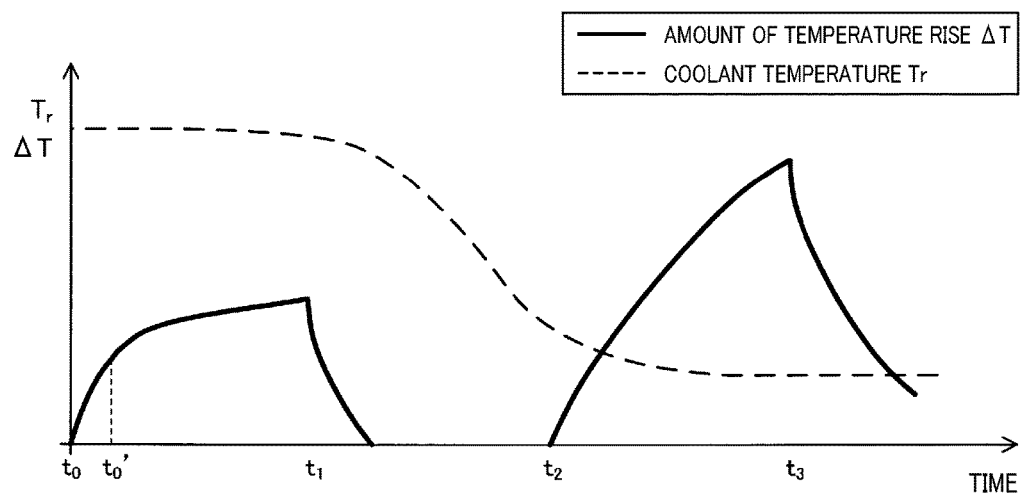
FIG. 22 is a graph showing variations with time of the amount of temperature rise of the semiconductor element and coolant temperature according to a comparative embodiment.
Figure 23:
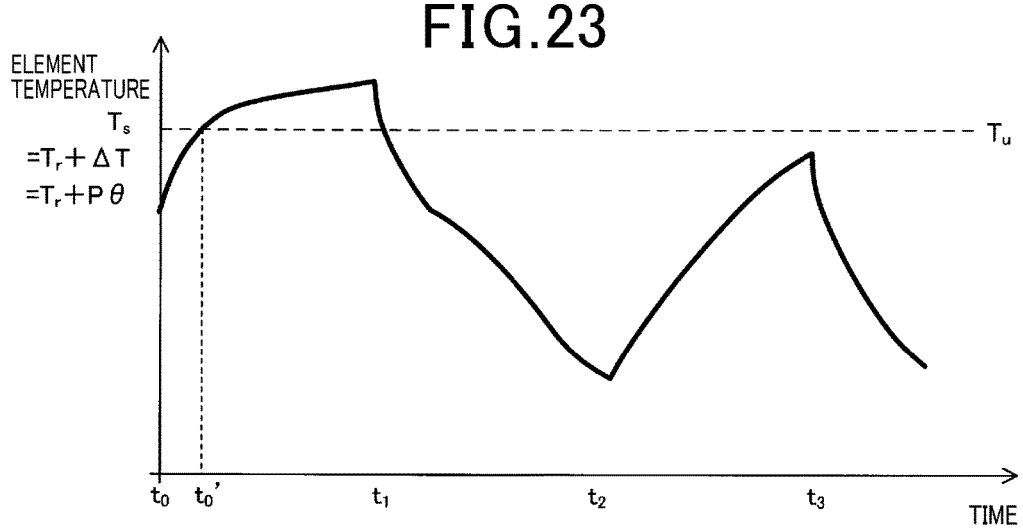
FIG. 23 is a graph showing a variation with time of element temperature according to the comparative embodiment.

If the turn-off speed is controlled based on the element temperature $T_s$ as in the conventional art, when the coolant temperature $T_r$ is high, the element temperature $T_s$ may easily exceed the upper limit value $T_u$. FIG. 22 and FIG. 23 are graphs showing variations with time of the coolant temperature $T_r$ and the like. Adding the amount $\Delta T$ of temperature rise to the coolant temperature $T_r$ obtains the element temperature $T_s$ shown in FIG. 23. In a case where the turn-off speed is controlled based on the element temperature $T_s$, as shown in FIG. 23, when the element temperature $T_s$ is lower than the upper limit value $T_u$ (time $t_0$ to $t_0'$), the controller 4 sets the turn-off speed to the relatively low second turn-off speed. Thereby, the loss of the semiconductor element 2 becomes large, and $\Delta T$ sharply rises (refer to FIG. 22). Thereby, as shown in FIG. 23, the element temperature $T_s$ exceeds the upper limit value $T_u$ at time $t_0'$. Hence, then, the controller 4 changes the turn-off speed to the relatively high first turn-off speed. Accordingly, then, the amount of heat generation decreases, $\Delta T$ slowly rises (refer to FIG. 22), and the element temperature $T_s$ gently rises. However, since the element temperature $T_s$ exceeds the upper limit value $T_u$ between the times $t_0'$ and $t_1$, the semiconductor element 2 easily deteriorates. Hence, to prevent the element temperature $T_s$ from exceeding the upper limit value $T_u$, it is required to enlarge the area of the semiconductor element 2 to decrease the amount of heat generation per unit area so as to restrain the amount of rise in the element temperature $T_s$. Accordingly, the manufacturing cost of the element temperature 2 easily increases.

In contrast, as in the present embodiment, controlling the turn-off speed based on the coolant temperature $T_r$ can resolve the above problems. That is, in the present embodiment, as shown in FIG. 4 and FIG. 5, when the coolant temperature $T_r$ is high (time $t_0$ to $t_1$), the turn-off speed is increased. Hence, the loss P can be reduced, and $\Delta T$ can be restrained. Hence, as shown in FIG. 6, the element temperature $T_s$ is difficult to exceed the upper limit value $T_u$. Hence, even if the area of the semiconductor element 2 is decreased to increase the amount of heat generation per unit area, it becomes difficult for the element temperature $T_s$ to exceed the upper limit value $T_u$. Accordingly, the semiconductor element 2 can be reduced in size, whereby the manufacturing cost of the element temperature 2 can be reduced.

Figure 14:
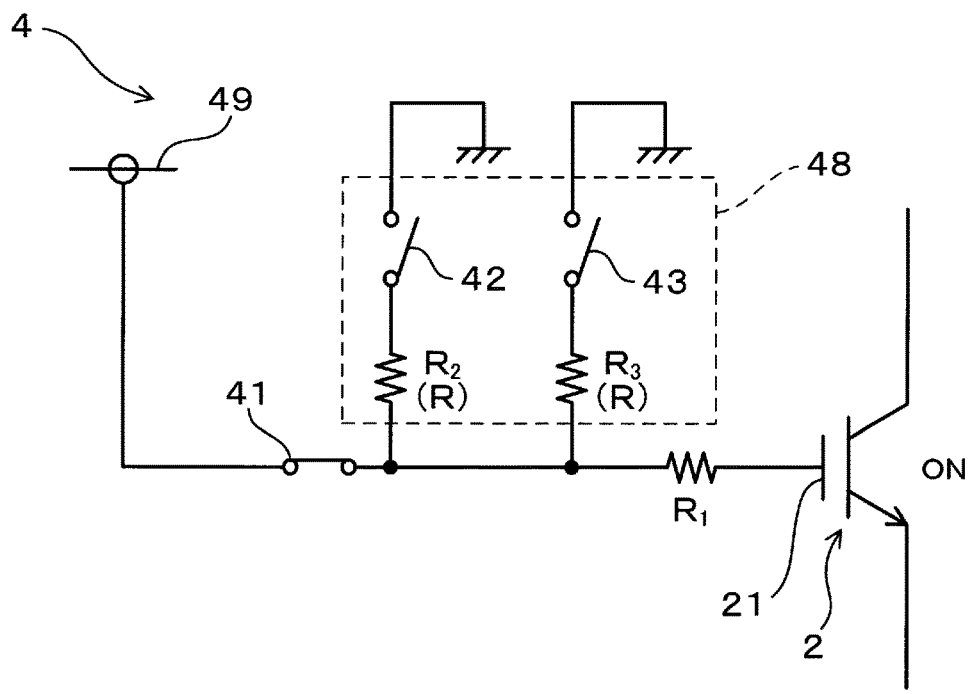
FIG. 14 is part of a circuit diagram of the controller showing a case where the semiconductor element is turned on according to the first embodiment.

Next, a method of switching between the first turn-off speed and the second turn-off speed will be described. As shown in FIG. 14, the controller 4 includes a first switch 41 and a variable resistor 48. The variable resistor 48 is provided between a control electrode 21 (gate electrode) of the semiconductor element 2 and the ground. The variable resistor 48 includes two resistors R (second resistor $R_2$, third resistor $R_3$) and two switches (second switch 42, third switch 43). The two resistors $R_2$ and $R_3$ are connected to each other in parallel. The second switch 42 and the second resistor $R_2$ are connected in series. In addition, the third switch 43 and the third resistor $R_3$ are connected in series.

When turning on the semiconductor element 2, as shown in FIG. 14, the controller 4 turns on the first switch 41 while turning off the second switch 42 and the third switch 43. Thereby, the voltage of a power supply circuit 49 is applied to the control electrode 21 of the semiconductor element 2. Hence, the semiconductor element 2 is turned on.

Figure 15:
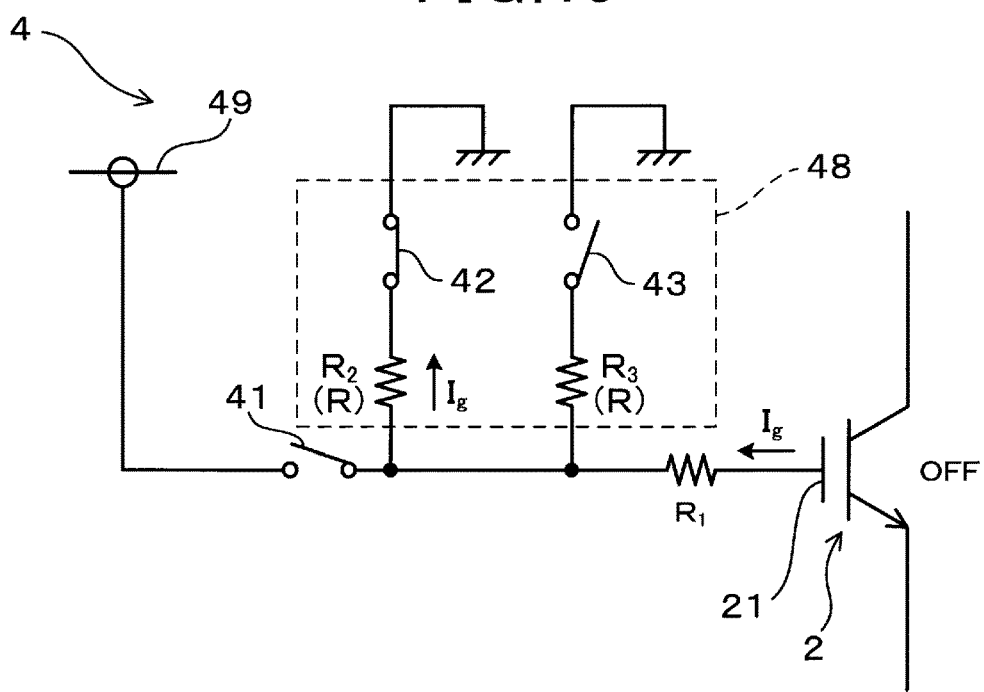
FIG. 15 is part of the circuit diagram of the controller showing a case where the semiconductor element is turned off when coolant temperature is lower than the threshold temperature according to the first embodiment.
Figure 16:
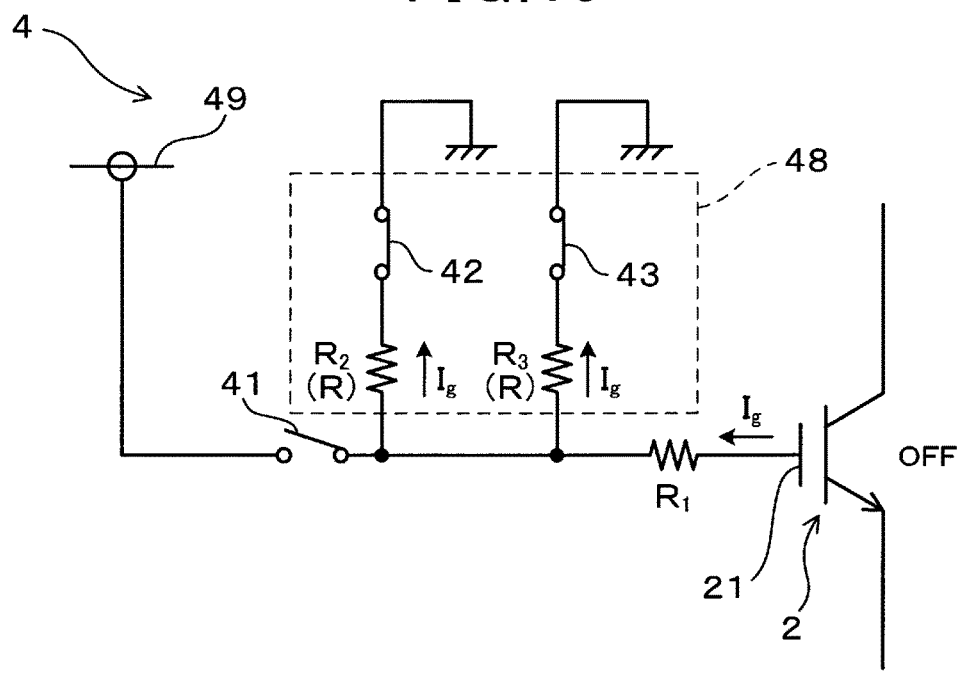
FIG. 16 is part of the circuit diagram of the controller showing a case where the semiconductor element is turned off when coolant temperature is higher than the threshold temperature according to the first embodiment.

In addition, when turning off the semiconductor element 2 is, as shown in FIG. 15 and FIG. 16, the controller 4 turns off the first switch 41 and turns on at least one of the two switches 42 and 43 provided in the variable resistor 48. Thereby, electric charge stored in the control electrode 21 (gate electrode) of the semiconductor element 2 becomes a current $I_g$, which flows to the ground through the switch and the resistor R.

When the coolant temperature $T_r$ is lower than the threshold temperature $T_{th}$, as shown in FIG. 15, the controller 4 turns on only the second switch 42, which is one of the two switches 42 and 43. Thereby, the resistance value of the variable resistor 48 becomes higher than that of the case where both the two switches 42 and 43 are turned on (refer to FIG. 16). Hence, the amount of the current $I_g$ flowing from the control electrode 21 becomes small, whereby the turn-off speed becomes the relatively low second turn-off speed.

In contrast, when the coolant temperature $T_r$ is higher than the threshold temperature $T_{th}$, as shown in FIG. 16, the controller 4 turns on both the second switch 42 and the third switch 43. Thereby, the resistance value of the variable resistor 48 becomes low. Hence, the amount of the current $I_g$ flowing from the control electrode 21 becomes large, whereby the turn-off speed becomes the relatively high first turn-off speed.

Next, the overall configuration of the power conversion apparatus 1 will be described. As shown in FIG. 11, in the present embodiment, a laminated body 10 is structured by laminating a plurality of semiconductor modules 3 and a plurality of cooling tubes 55. The capacitor 7 is disposed at the position which is adjacent to the laminated body 10 in the lamination direction (X direction) of the laminated body 10. The laminated body 10 and the capacitor 7 are accommodated in a case 11.

As shown in FIG. 10, the semiconductor module 3 includes a main body 31, control terminals 32 projecting from the main body 31, and power terminals 33. The main body 31 includes the semiconductor elements 2. The power terminals 33 are DC terminals 33p and 33n, to which DC voltage is applied, and an AC terminal 33C connected to the motor 81 (refer to FIG. 13). The control terminals 32 are connected to the controller 4.

In addition, as shown in FIG. 11, two cooling tubes 55 adjacent to each other in the X direction are connected by connecting tubes 52 at both ends of the cooling tubes 55 in the width direction (Y direction) orthogonal to both the projection direction of the power terminals 33 (Z direction) and the X direction. In addition, an end cooling tube 55a, which is the farthest from the capacitor 7 among the plurality of cooling tubes 55, is connected with an inlet tube 53 for introducing the coolant 50 and an outlet tube 54 for discharging the coolant 50. When the coolant 50 is introduced from the inlet tube 53, the coolant 50 flows into all the cooling tubes 55 through the connecting tube 52, and is discharged from the outlet tube 54. Thereby, the semiconductor modules 3 are cooled. Note that the cooler 5 of the present embodiment includes the plurality of cooling tubes 55, the connecting tubes 52, the inlet tube 53, and the outlet tube 54.

In addition, as shown in FIG. 11, a pressing member 12 (plate spring) is disposed between the laminated body 10 and the capacitor 7. The pressing member 12 presses the laminated body 10 toward a wall 111 of the case 11. Thereby, the laminated body 10 is fixed in the case while the contact pressure between cooling tubes 55 and the semiconductor modules 3 is ensured.

In addition, as shown in FIG. 12, the capacitor 7 includes capacitor elements 71, a capacitor case 72, a sealing member 73, and electrode plates 74. The capacitor elements 71 are accommodated in the capacitor case 72 and are sealed by the sealing member 73. In addition, electrode surfaces of the capacitor elements 71 are connected with the electrode plates 74. The electrode plates 74 are connected to the DC terminals 33p and 33n (refer to FIG. 10) of the semiconductor modules 3 (refer to FIG. 10) via a DC bus bar, which is not shown. In addition, as shown in FIG. 12, the controller 4 is fixed to a bottom wall 721 of the capacitor case 72.

Next, operational advantages of the present embodiment will be described. As shown in FIG. 2, the controller 4 increases the turn-off speed of the semiconductor element 2 as the coolant temperature $T_r$ rises.

Hence, the element temperature $T_s$ can be prevented from exceeding the upper limit value $T_u$ (refer to FIG. 6), and the manufacturing cost of the power conversion apparatus can be reduced. That is, as shown in FIG. 4 and FIG. 5, when the coolant temperature $T_r$ is high (between times $t_0$ and $t_1$), the controller 4 of the present embodiment increases the turn-off speed. Hence, when the coolant temperature $T_r$ is high, and it is difficult to cool the semiconductor element 2, the loss P of the semiconductor element 2 can be reduced. Accordingly, as shown in FIG. 6, the element temperature $T_s$ is easily prevented from exceeding the upper limit value $T_u$. Hence, even if the area of the semiconductor element 2 is decreased to increase the amount of heat generation per unit area, it becomes difficult for the element temperature $T_s$ to exceed the upper limit value $T_u$. Accordingly, the semiconductor element 2 can be reduced in size, whereby the manufacturing cost can be reduced.

In addition, as shown in FIG. 7, when the coolant temperature $T_r$ is high, the withstand voltage of the semiconductor element 2 becomes high. When the coolant temperature $T_r$ is low, the withstand voltage of the semiconductor element 2 becomes low. Hence, as shown in FIG. 9, even if a high turn-off surge $\Delta V$ is generated by increasing the turn-off speed when the coolant temperature $T_r$ is high, the semiconductor element 2 can be sufficiently protected from the turn-off surge $\Delta V$ because the withstand voltage of the semiconductor element 2 is high. In addition, as shown in FIG. 8, when the coolant temperature $T_r$ is low, the turn-off surge $\Delta V$ can be reduced because the turn-off speed is decreased. Hence, when the coolant temperature $T_r$ is low, and the withstand voltage is low, the turn-off surge $\Delta V$ can be reduced, whereby the semiconductor element 2 can be protected from the turn-off surge $\Delta V$.

In addition, as shown in FIG. 2, the controller 4 of the embodiment increases the turn-off speed step by step as the coolant temperature $T_r$ rises.

As described later, although the turn-off speed can also be continuously increased as the coolant temperature $T_r$ rises, the circuit configuration easily becomes complex. Hence, as in the present embodiment, increasing the turn-off speed step by step can simplify the circuit configuration of the controller 4, whereby the manufacturing cost of the power conversion apparatus 1 can be reduced.

In addition, as shown in FIG. 14 to FIG. 16, the controller 4 of the present embodiment includes the variable resistor 48 connected between the control electrode 21 of the semiconductor element 2 and the ground. The controller 4 is configured so as to control the turn-off speed by changing the resistance value of the variable resistor 48.

Hence, the turn-off speed can be easily changed to the first turn-off speed or the second turn-off speed.

As described above, according to the present embodiment, a power conversion apparatus can be provided that can prevent an element temperature from exceeding an upper limit value, that is highly resistant to turn-off surge, and that can reduce the manufacturing cost thereof.

In the following embodiments, reference numerals that are used in the figures and are the same as those used in the first embodiment represent components and the like similar to those of the first embodiment, if not otherwise specified.

Second Embodiment

Figure 17:
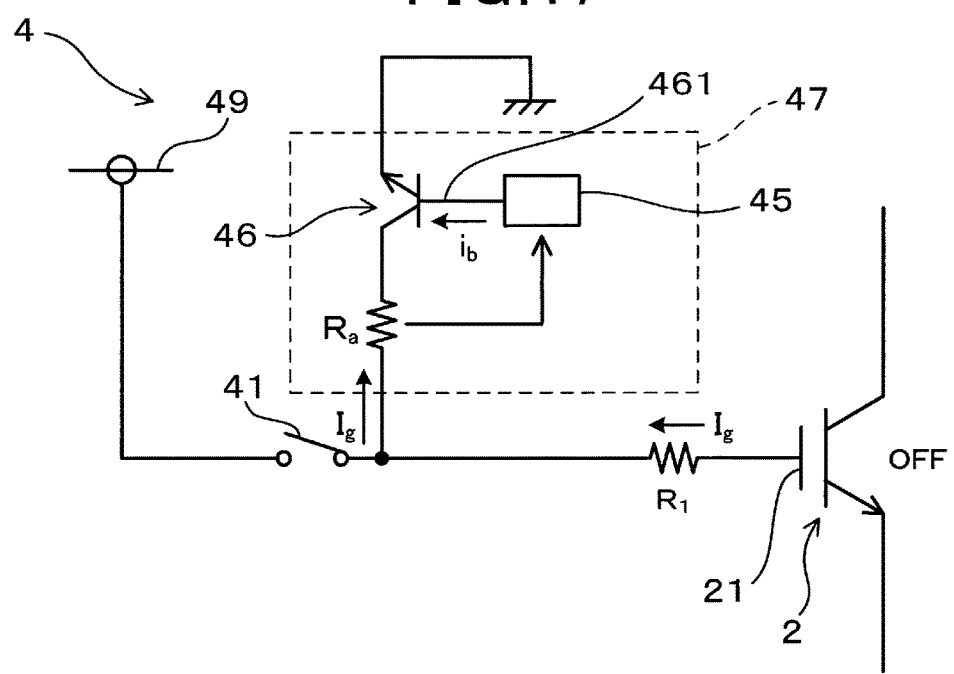
FIG. 17 is part of a circuit diagram of the controller according to a second embodiment.

The present embodiment is an example in which the circuit configuration of the controller 4 is modified. As shown in FIG. 17, the controller 4 of the present embodiment includes a constant current circuit 47 connected between the control electrode 21 of the semiconductor element 2 and the ground. The constant current circuit 47 controls the value of the current $I_g$ flowing from the control electrode 21 to the ground so as to be constant and can change the current value to a predetermined value. The controller 4 changes the value of the current $I_g$ by using the constant current circuit 47 to control the turn-off speed of the semiconductor element 2.

The constant current circuit 47 includes a resistor $R_a$, a transistor 46, and a current controller 45. The resistor $R_a$ and the transistor 46 are connected in series. In addition, the current controller 45 is connected to a base 461 of the transistor 46. The constant current circuit 47 feeds back the voltage drop, which is generated across the resistor $R_a$ by the current $I_g$, to the current controller 45. The current controller 45 adjusts a base current $i_b$ so that the voltage drop becomes constant, that is, so that the current $I_g$ becomes constant.

The constant current circuit 47 is configured so that the value of the current $I_g$ can be switched between a relatively high first current value $I_{g1}$ and a relatively low second current value $I_{g2}$.

When turning on the semiconductor element 2, as in the first embodiment, the controller 4 turns on the first switch 41. Thereby, the voltage of the power supply circuit 49 is applied to the control electrode 21 to turn on the semiconductor element 2. When turning off the semiconductor element 2, the controller 4 turns off the first switch 41 and turns on the transistor 46. Then, the charge stored in the control electrode 21 flows, as the current $I_g$, to the ground through the constant current circuit 47.

When the coolant temperature $T_r$ is higher than the threshold temperature $T_{th}$, the constant current circuit 47 sets the value of the current $I_g$ to the relatively high first current value $I_{g1}$. Thereby, the turn-off speed is set to the relatively high first turn-off speed. In contrast, when the coolant temperature $T_r$ is lower than the threshold temperature $T_{th}$, the constant current circuit 47 sets the value of the current $I_g$ to the relatively low second current value $I_{g2}$. Thereby, the turn-off speed is set to the relatively low second turn-off speed.

In addition, the second embodiment includes configurations and operational advantages similar to those of the first embodiment.

Third Embodiment

Figure 18:
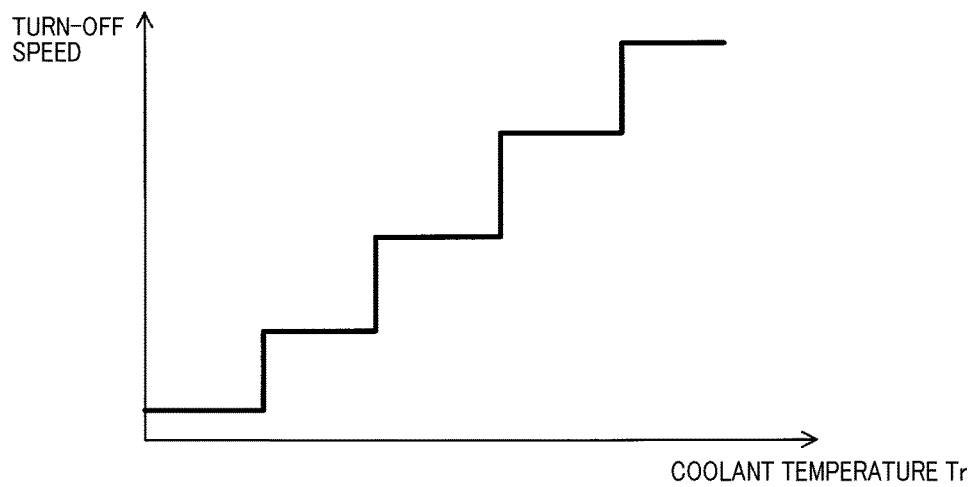
FIG. 18 is a graph showing a relationship between turn-off speed of the semiconductor element and coolant temperature according to a third embodiment.
Figure 19:
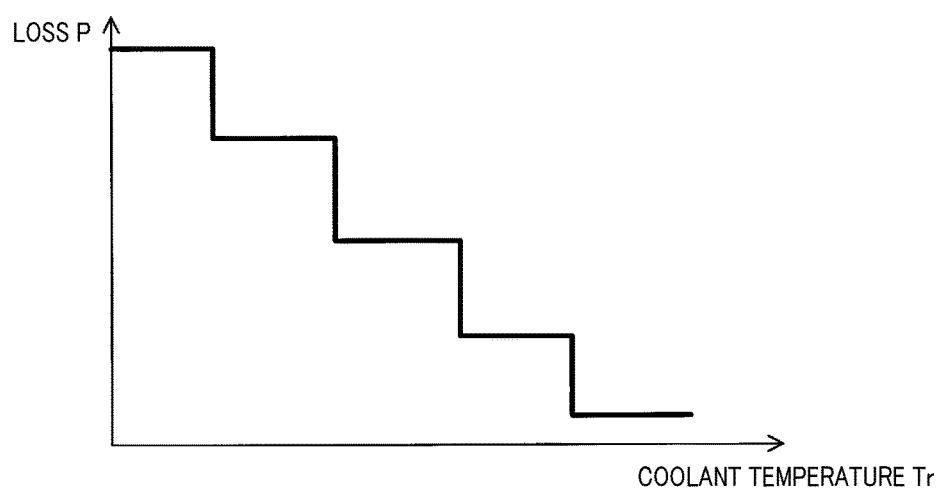
FIG. 19 is a graph showing a relationship between a loss of the semiconductor element and coolant temperature according to the third embodiment.

The present embodiment is an example in which the number of changing the turn-off speed is modified. As shown in FIG. 18, in the present embodiment, as the coolant temperature $T_r$ rises, the turn-off speed is increased multiple times step by step. Hence, as shown in FIG. 19, as the coolant temperature $T_r$ rises, the loss of the semiconductor element 2 decreases multiple times step by step.

In the present embodiment, since the turn-off speed is changed multiple times as the coolant temperature $T_r$ rises, the turn-off speed can be a value more suitable for the coolant temperature $T_r$. Hence, the element temperature $T_s$ can be prevented from exceeding the upper limit value $T_u$ more effectively.

In addition, the third embodiment includes configurations and operational advantages similar to those of the first embodiment.

Fourth Embodiment

Figure 20:
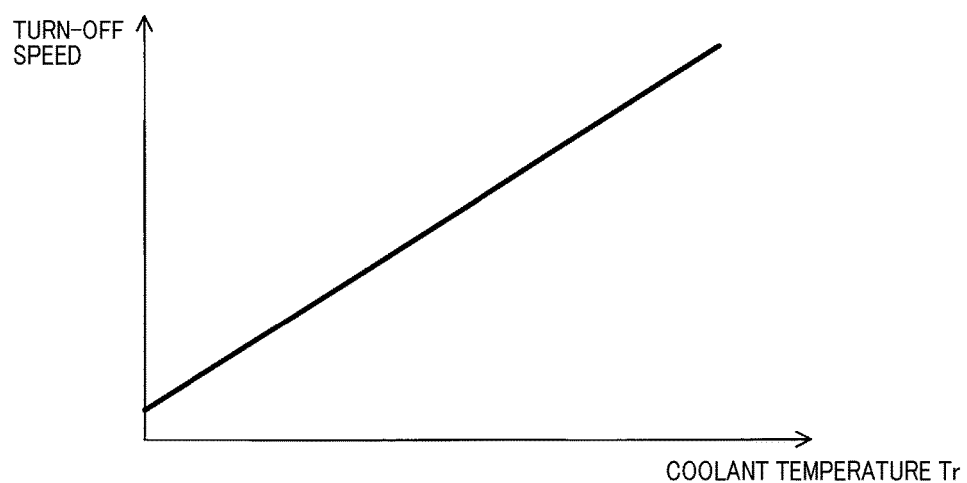
FIG. 20 is a graph showing a relationship between turn-off speed of the semiconductor element and coolant temperature according to a fourth embodiment.
Figure 21:
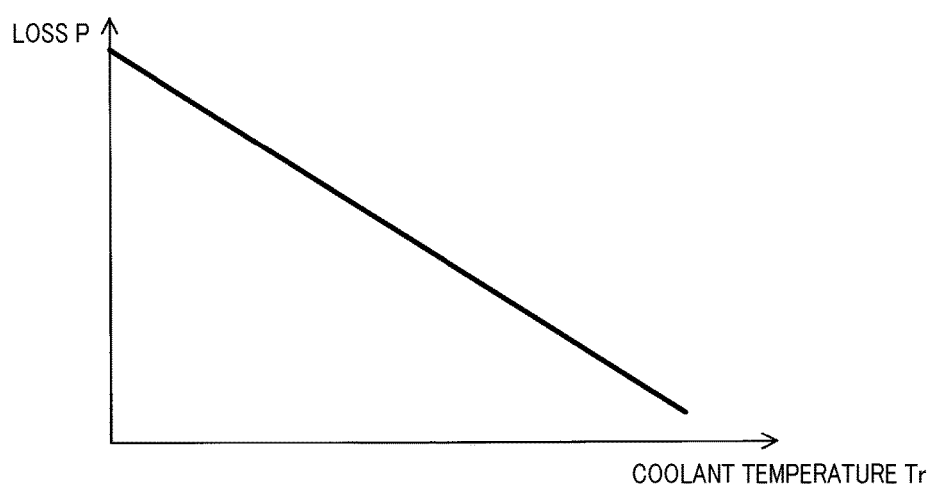
FIG. 21 is a graph showing a relationship between a loss of the semiconductor element and coolant temperature according to the fourth embodiment.

The present embodiment is an example in which the variation of the turn-off speed with respect to the coolant temperature $T_r$ is modified. In the present embodiment, as shown in FIG. 20, as the coolant temperature $T_r$ rises, the turn-off speed is continuously increased. Hence, as shown in FIG. 21, as the coolant temperature $T_r$ rises, the loss of the semiconductor element 2 continuously decreases.

According to the above configuration, the turn-off speed can be the value most suitable for the coolant temperature $T_r$. Hence, the element temperature $T_s$ can be prevented from exceeding the upper limit value $T_u$ further more effectively.

In addition, the fourth embodiment includes configurations and operational advantages similar to those of the first embodiment.

What is claimed is:

1. A power conversion apparatus comprising:
a semiconductor module that includes a semiconductor element;
a controller that is connected to the semiconductor module and controls a switching operation of the semiconductor element;
a cooler that has a flow path, through which a coolant flows, and cools the semiconductor element; and
a temperature sensor that measures a coolant temperature, which is a temperature of the coolant, wherein
the controller controls a turn-off speed of the semiconductor element based on a measurement value of the coolant temperature measured by the temperature sensor so that the turn-off speed increases step-by-step as the coolant temperature rises, the controller configured to increase the turn-off speed by more than two steps as the coolant temperature rises, and
the controller includes a constant current circuit that is connected between a control electrode of the semiconductor element and a ground, that controls a value of a current flowing from the control electrode to the ground so as to be constant, and that is capable of changing the value of the current to a predetermined value, and the controller changes the value of the current by using the constant current circuit to control the turn-off speed.

2. A power conversion apparatus comprising:
a semiconductor module that includes a semiconductor element;
a controller that is connected to the semiconductor module and controls a switching operation of the semiconductor element;
a cooler that has a flow path, through which a coolant flows, and cools the semiconductor element; and
a temperature sensor that measures a coolant temperature, which is a temperature of the coolant, wherein
the controller controls a turn-off speed of the semiconductor element based on a measurement value of the coolant temperature measured by the temperature sensor so that the turn-off speed continues to increase as the coolant temperature continues to rise, and
the controller includes a constant current circuit that is connected between a control electrode of the semiconductor element and a ground, that controls a value of a current flowing from the control electrode to the ground so as to be constant, and that is capable of changing the value of the current to a predetermined value, and the controller changes the value of the current by using the constant current circuit to control the turn-off speed.

3. The power conversion apparatus according to claim 2, wherein
the controller controls the turn-off speed so that the turn-off speed increases linearly as the coolant temperature rises linearly.

* * * * *